United States Patent

Bailey

[11] Patent Number: 5,867,028
[45] Date of Patent: Feb. 2, 1999

[54] BATTERY TESTER HAVING SECTIONS OF DIFFERENT RESISTIVITY

[75] Inventor: John C. Bailey, Columbia Station, Ohio

[73] Assignee: Eveready Battery Company, Inc., St. Louis, Mo.

[21] Appl. No.: 900,278

[22] Filed: Jul. 25, 1997

[51] Int. Cl.⁶ ........................ G01N 27/416; H01M 10/48
[52] U.S. Cl. ........................ 324/435; 324/104; 429/93; 359/273; 320/DIG. 18
[58] Field of Search .................... 324/435, 96, 104; 320/48, DIG. 18; 340/636; 345/87, 88, 89, 104; 359/265, 269, 270, 273; 429/90, 93

[56] References Cited

U.S. PATENT DOCUMENTS

| | | | |
|---|---|---|---|
| 4,006,414 | 2/1977 | Parker | 324/96 |
| 4,118,112 | 10/1978 | Thornburg | 324/96 |
| 4,371,827 | 2/1983 | Mullersman et al. | 340/636 |
| 4,379,816 | 4/1983 | Mullersman et al. | 429/91 |
| 4,392,102 | 7/1983 | Sugalski et al. | 320/110 |
| 4,421,560 | 12/1983 | Kito et al. | 106/31.2 |
| 4,702,563 | 10/1987 | Parker | 324/104 |
| 4,702,564 | 10/1987 | Parker | 324/104 |
| 4,723,656 | 2/1988 | Kiernan et al. | 324/104 |
| 4,726,661 | 2/1988 | Parker | 324/104 |
| 4,835,475 | 5/1989 | Hanakura et al. | 324/435 |
| 4,835,476 | 5/1989 | Kurosawa | 324/435 |
| 5,015,544 | 5/1991 | Burroughs et al. | 429/93 |
| 5,059,895 | 10/1991 | Cataldi et al. | 324/104 |
| 5,128,616 | 7/1992 | Palmer | 324/435 |
| 5,156,931 | 10/1992 | Burroughs et al. | 429/93 |
| 5,188,231 | 2/1993 | Kivell et al. | 206/705 |
| 5,223,003 | 6/1993 | Tucholski et al. | 429/93 |

(List continued on next page.)

FOREIGN PATENT DOCUMENTS

| | | |
|---|---|---|
| 495636A2 | 7/1992 | European Pat. Off. |
| 523901 | 1/1993 | European Pat. Off. |
| 495636A3 | 3/1994 | European Pat. Off. |
| 450938 | 12/1995 | European Pat. Off. |
| 3738731 | 5/1988 | Germany. |
| 57-153275 | 9/1982 | Japan. |
| 63-179269 | 7/1988 | Japan. |
| 2-41365 | 3/1990 | Japan. |
| 2-100269 | 4/1990 | Japan. |
| 313379 | 1/1991 | Japan. |
| 43-29384 | 11/1992 | Japan. |
| 43-29385 | 11/1992 | Japan. |
| 8600282A | 9/1987 | Netherlands. |
| 2282697 | 4/1995 | United Kingdom. |

OTHER PUBLICATIONS

Robert Parker, "Solid State RMS Recording Ammeter," Lawrence Livermore Laboratory, University of California, 1972 (month unavailable).

Carl M. Lampert et al., "Large–Area Chromogenics: Materials and Devices for Transmittance Control," *SPIE Institutes for Advanced Optical Technologies*, vol. IS 4, 1988 (month unavailable).

*Primary Examiner*—Diep N. Do
*Attorney, Agent, or Firm*—Robert W. Welsh; Michael C. Pophal

[57] ABSTRACT

The battery tester of the present invention includes a heating element for generating heat in response to current supplied from a battery, and an indicator provided in proximity to the heating element for providing a visual indication of the remaining capacity of the battery in response to the heat generated by the heating element. The heating element has a display portion and first and second connecting portions on either side of the display portion that are selectively coupled to opposite terminals of the battery. The connecting portions of the heating elements have a lower resistivity than the display portion thereby reducing the heat generated at the switch contacts that are pressed by the user to activate the tester.

28 Claims, 5 Drawing Sheets

U.S. PATENT DOCUMENTS

| | | | |
|---|---|---|---|
| 5,231,356 | 7/1993 | Parker | 324/435 |
| 5,393,618 | 2/1995 | Weiss et al. | 429/90 |
| 5,409,788 | 4/1995 | Weiss et al. | 429/93 |
| 5,418,085 | 5/1995 | Huhndorff et al. | 429/93 |
| 5,418,086 | 5/1995 | Bailey | 429/93 |
| 5,458,992 | 10/1995 | Bailey | 429/93 |
| 5,478,665 | 12/1995 | Burroughs et al. | 324/435 |
| 5,491,420 | 2/1996 | Parker | 324/104 |
| 5,494,496 | 2/1996 | Huhndorff et al. | 29/623.5 |
| 5,525,439 | 6/1996 | Huhndorff et al. | 429/93 |
| 5,538,806 | 7/1996 | Weiss et al. | 429/90 |
| 5,578,390 | 11/1996 | Hughen | 429/93 |
| 5,600,231 | 2/1997 | Parker | 324/435 |
| 5,604,049 | 2/1997 | Weiss et al. | 429/93 |
| 5,626,978 | 5/1997 | Weiss et al. | 429/90 |
| 5,654,640 | 8/1997 | Bailey | 324/435 |
| 5,667,538 | 9/1997 | Bailey | 429/93 |

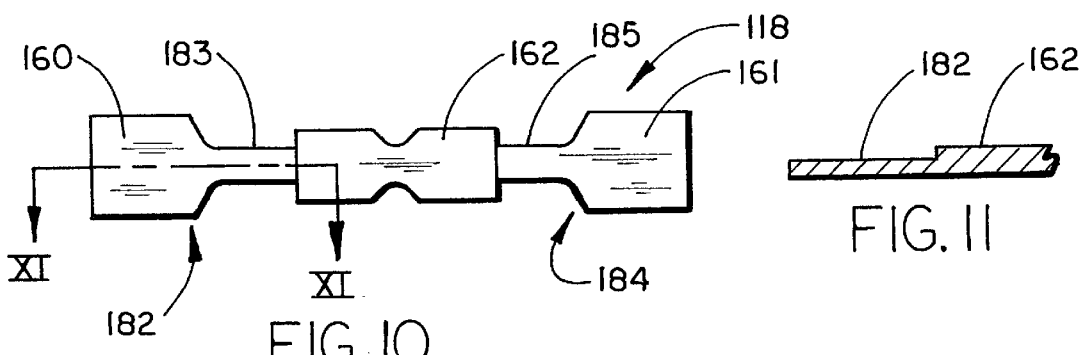
FIG. 10
FIG. 11
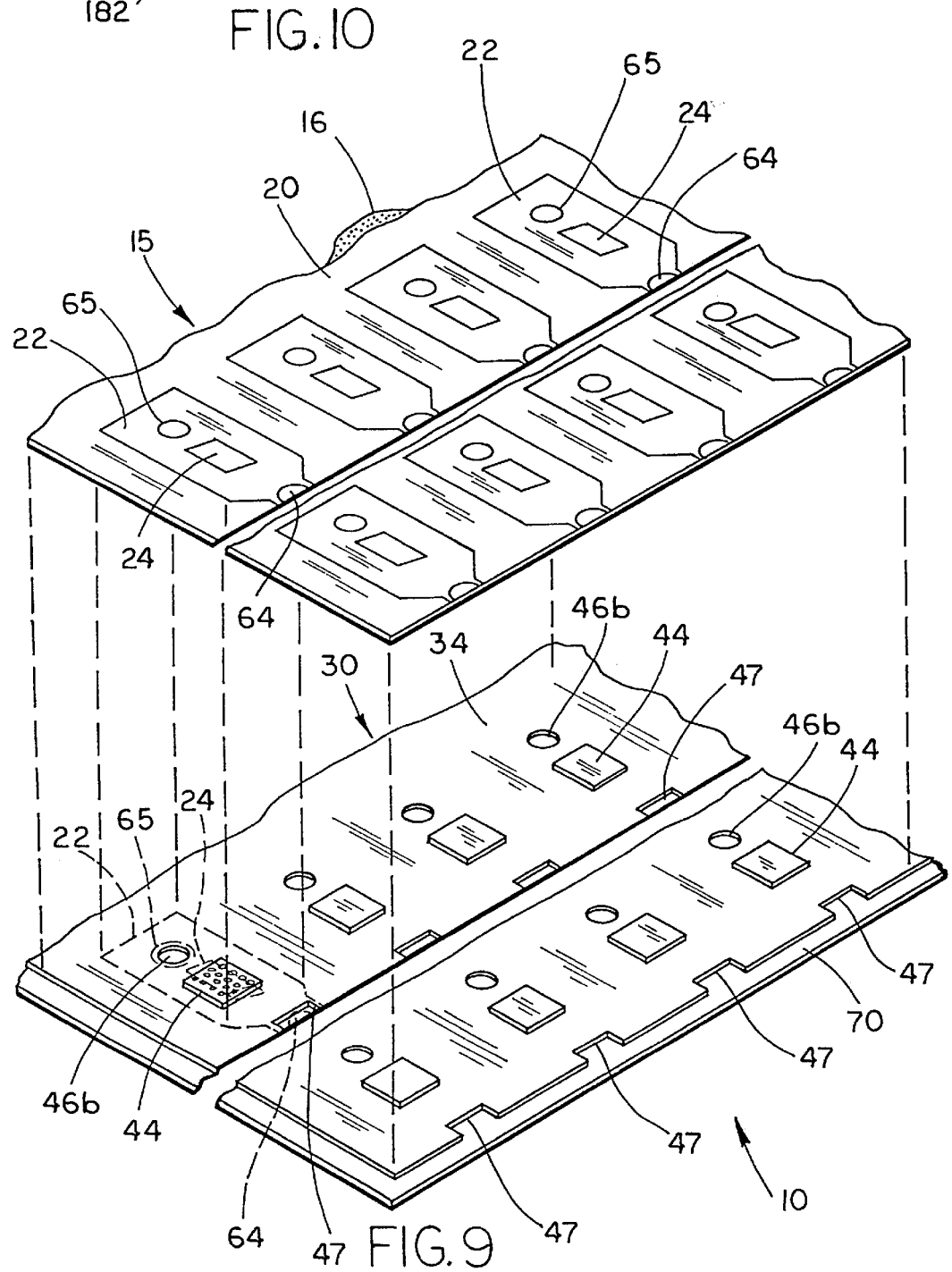
FIG. 9

BATTERY TESTER HAVING SECTIONS OF DIFFERENT RESISTIVITY

BACKGROUND OF THE INVENTION

The present invention generally pertains to battery testers, and more particularly, relates to on-label thermochromic battery testers.

Batteries are often stored before being used. Batteries are typically stored by retailers before being sold. After purchase by a consumer, such batteries are again typically stored for some period of time prior to use. If the period of storage is significant, batteries may self-discharge. Therefore, it is desirable to utilize a battery tester to determine if a battery has sufficient charge to operate a desired device.

It is also desirable, on frequent occasions, to determine the remaining life of batteries which are in use. Many "good" batteries are discarded simply because the user cannot recall how long they have been used in a particular device, i.e., a camera, tape deck, etc. For similar reasons, batteries often reach a useless or near useless state of discharge when no replacements are readily available. Separate or stand-alone battery testers are known which indicate remaining battery power. However, such testers are easily misplaced and cumbersome to use.

Battery testers have been described that are included in a label secured to a battery. One type of on-label battery tester is known as a "thermochromic battery tester." Thermochromic battery testers typically include a conductive element that is selectively connected between opposite terminals of the battery. The conductive element includes a switch pad at one or both ends that is pressed by the user to connect the conductive element across the terminals of the battery. When the conductive element is connected between the battery terminals, it generates heat as a function of its resistivity and the current flowing from the battery. The level of current produced by the battery is one indicator of remaining battery capacity. Thermochromic testers further include a thermochromic layer, which changes its color or visual appearance as a function of the heat generated by the conductive element. By changing the visual appearance of the thermochromic layer, a thermochromic on-label battery tester may provide an indication of the discharge level of the battery. For example, a thermochromic material that changes between opaque and transparent states may be utilized to expose indicia underlying the thermochromic layer indicating that the battery is still "good" when a sufficient level of current is output from the battery.

To produce such thermochromic battery testers in the simplest manner and at the lowest cost, the conductive heating element is printed at a single printing station using a single conductive ink material. A suitable material that may be readily printed on a substrate and that exhibits suitable heat-generating properties in response to the current from the battery, is silver ink. The silver ink is typically printed so that the resistivity of the ink film is the same in all portions of the circuit. Although the thermal flux can be focused by making the circuit narrower and the resistance higher where a high flux is required, the entire circuit acts as a heater. As a result, a low resistance circuit which draws high current is required to produce sufficient thermal flux in the display section. Because silver ink is relatively expensive, the conductive heating element thus constitutes a significant portion of the total cost of providing a battery tester on a battery label.

Another problem associated with conventional thermochromic on-label battery testers is that the contact switches that a user is required to press to activate the tester may become relatively hot due to the high current levels flowing through the conductive element. Although the heat generated at the switch contacts is not hot enough to burn the user's fingers, this heat nevertheless may create an unpleasant sensation for the user.

SUMMARY OF THE INVENTION

Accordingly, one aspect of the present invention is to solve the above problems by providing an on-label thermochromic battery tester that is lower in cost and that has reduced levels of heat generated at the switch contacts. To achieve these and other aspects and advantages, the battery tester of the present invention comprises a heating element having a display portion and first and second connecting portions on either side of the display portion that have a lower resistivity than the display portion. The lower resistivity of the connecting portions may be achieved by using a different material than that used for the display portion or using the same material for both the display and the connecting portions but changing a property in the layers that results in a lower resistivity for the connecting portions. For example, the thickness of the display portion layer may be reduced relative to the connecting portions or a binder fraction may be higher for the display portion than for the connecting portion.

The features and advantages of the invention may be realized and obtained by means of the instrumentalities and combinations particularly pointed out in the written description and claims hereof, as well as the appended drawings.

BRIEF DESCRIPTION OF THE DRAWINGS

In the drawings:

FIG. 9 is an exploded view of a plurality of battery tester labels disposed on a common releasable liner;

FIG. 10 is a top view of a conductive circuit constructed in accordance with a second embodiment of the present invention; and FIG. 11 is a partial cross section of a variation of the conductive circuit of the present invention taken along plane XI—XI of FIG. 10.

DETAILED DESCRIPTION OF PREFERRED EMBODIMENTS

Figure 1:
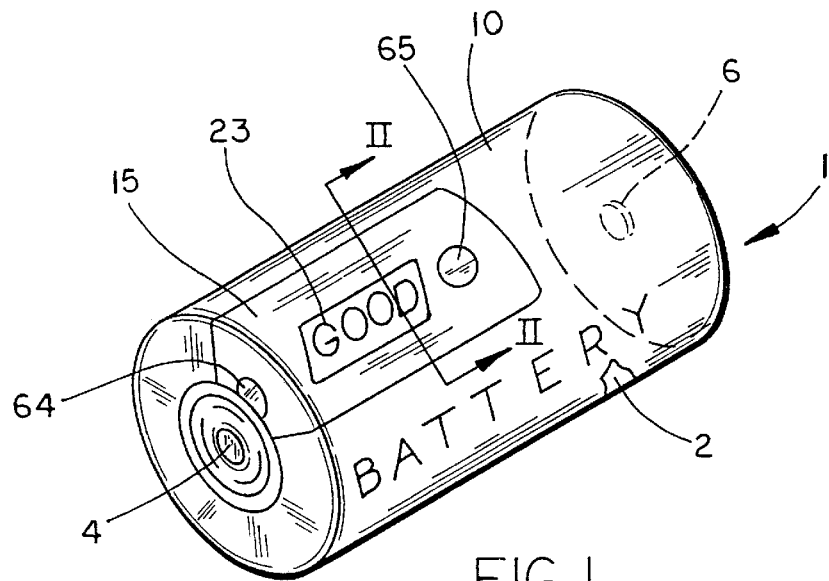
FIG. 1 is an illustration of a battery having a battery tester label in accordance with this invention disposed about the outer periphery of the battery.

FIG. 1 illustrates a battery and label assembly 1 comprising a battery can 2, a negative terminal 4, and a positive terminal 6. Can 2 may be in electrical contact with positive terminal 6. Battery 1 may include one or more electrochemical cells, which may be primary or secondary cells. Extending around and attached to the periphery of can 2 is a label 10 including a battery tester device 15, which is the subject of this invention. As shown, tester device 15 comprises switches 64 and 65 which activate tester 15 to indicate the state of charge of the battery by exposing indicia 23 or producing some other visual indication.

Figure 5:
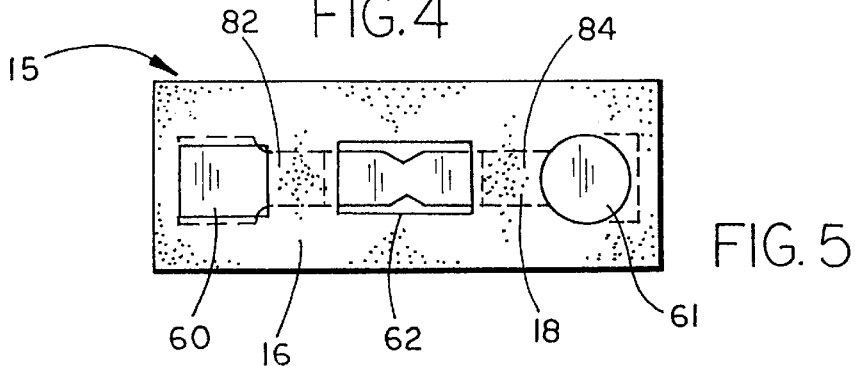
FIG. 5 is a bottom plan view of the inserted tester device, the cross-hatching indicating a layer of adhesive.

As illustrated in FIGS. 2–5, tester device 15 generally comprises a laminate or layered assembly having a substrate layer 20, an elongated electrically conductive circuit 18 disposed on a first face of substrate 20, and a pressure-sensitive adhesive 16 disposed on portions of both conductive circuit 18 and the first face of substrate 20. Adhesive 16, indicated by cross-hatching in FIG. 5, is preferably applied over conductive layer 18 in the pattern illustrated. Adhesive 16 is omitted from those areas which will overlie printed insulation 44 and switch pads 42 (FIGS. 6 and 8) when tester 15 is affixed to a base laminate 30. This adhesive pattern retards moisture from migrating to switch segments 60 and 61 of conductive circuit 18 while not interfering with the function of either the switches or the insulation discussed below.

Tester device 15 further comprises one or more graphic layers 22, preferably of decorative ink, and indicia 23 that are disposed on a second face of substrate 20 opposite the face containing conductive circuit 18. Tester device 15 also comprises a layer of a temperature-sensitive (i.e., thermochromic) indicating material 24 that is deposited upon the second face of substrate 20, preferably upon graphic layers 22 and indicia 23. A layer of a clear protective coating (not shown) is preferably deposited over indicator layer 24 and optionally upon graphic layers 22 and other exposed regions of the second face of substrate 20.

Conductive circuit 18 preferably has a central display portion 62 provided between two lower resistivity portions 82 and 84. The low resistivity portions 82 and 84 include switch segments 60 and 61. By forming switch segments 60 and 61 in a portion of conductive circuit 18 having a lower resistivity, the amount of heat generated at the contact switches 64 and 65 is substantially reduced. Conductive circuit 18 may be made of a single material such as a highly-conductive silver ink layer. To obtain different resistivities in portions 62, 82, and 84, the thickness of the layer forming portion 62 may be relatively thinner than that of connecting portions 82 and 84 or the binder fraction in the ink may be increased for portion 62.

An alternative method for obtaining different resistivities in the portions of conductive circuit 18 is to utilize different materials for these portions. For example, if connecting portions 82 and 84 are formed using a silver ink, central display portion 62 may be formed using materials of higher resistance such as carbon, nickel, silver-plated copper, or combinations of these materials.

The ratio of resistivities of display portion 62 to connecting portions 82 and 84 is preferably about 10:1, with the resistivity of display portion 62 being within the range of 100 m$\Omega$/cm$^2$ to 10$\Omega$/cm$^2$ and the resistivity of connecting portions 82 and 84 being within the range of 10 to 200 m$\Omega$/cm$^2$. It will be appreciated, however, that the present invention may be practiced using resistivities outside these preferred ranges and at ratios different from the preferred ratio identified above. Moreover, the preferred values listed above are those for a 1.5 V cell. Different values may be desirable for different cell constructions and types.

FIG. 10 shows a conductive circuit 118 having a pattern according to a second embodiment of the invention. As shown, connecting portions 182 and 184 include narrower sections 183 and 185 that connect between display portion 162 and switch segments 160 and 161, respectively. Like the first embodiment, the resistivity of connecting portions 182 and 184 is lower than that of display portion 162. This difference in resistivity may be accomplished by making the connecting portions thinner than the display portion (as shown in FIG. 11) or by making these portions of different materials.

By using less-expensive materials, such as copper, in place of the silver ink that is commonly used, and/or by narrowing the width of silver connecting portions 82 and 84 (182 and 184), the cost of conductive circuit 18 may be significantly reduced particularly when the tester circuit is configured to extend the entire length of the battery.

Figure 2:
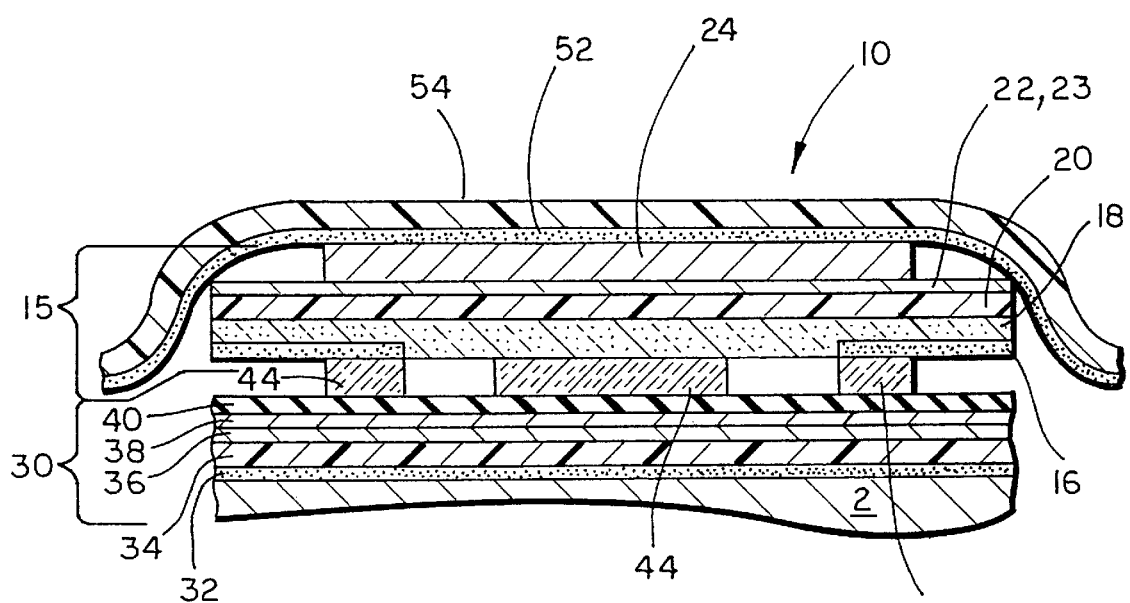
FIG. 2 is a cross section of the battery tester label taken along plane II—II of FIG. 1.
Figure 3:
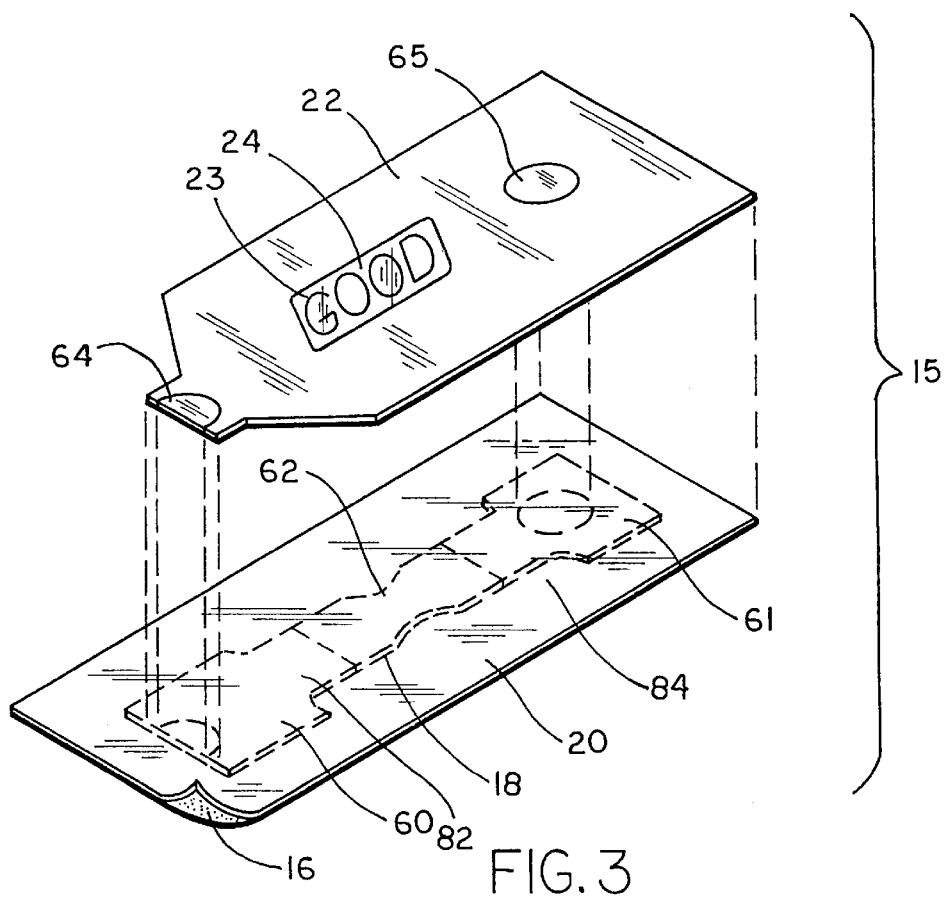
FIG. 3 is an exploded view of a subcomponent of the battery tester label, referred to herein as the tester device.
Figure 4:
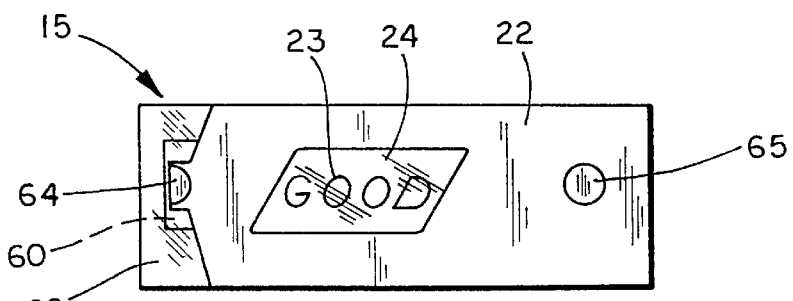
FIG. 4 is a top plan view of the inserted tester device.

The tester device 15, as shown in FIGS. 2–5 and 8, is preferably prepared as follows. A plastic film is provided for substrate 20. Although FIG. 3 illustrates substrate 20 as being transparent, substrate 20 could be formed from a wide variety of other materials including opaque and translucent materials. Conductive circuit 18 is deposited on one face of substrate 20. Conductive circuit 18 is preferably deposited in the form of a pattern comprising two distal regions for forming switches, referred to and illustrated herein as switch segments 60 and 61, and a medially disposed area 62 which undergoes an increase in temperature upon passage of electrical current. The pressure-sensitive adhesive material 16 is deposited on at least portions of either or both conductive circuit 18 and a face of substrate 20. As previously noted, particular regions of conductive circuit 18 are left exposed and not covered with pressure-sensitive adhesive 16; namely, the switch segments 60 and 61 and area of controlled resistivity 62. A silicone-coated release liner, such as a silicone-coated paper or plastic film (not shown), is applied onto the previously deposited pressure-sensitive adhesive 16 to facilitate handling and/or storage of tester device 15.

Graphics and/or other labeling colors 22 in the form of a layer or layers of decorative ink and indicia 23 are printed onto the opposite side of substrate 20 from that on which the conductive circuit 18 is positioned. It is preferred that indicia 23 be disposed directly above the area of controlled resistivity 62 of conductive circuit 18 located on the other side of substrate 20. Additional graphics are also preferably printed to designate switch regions 64 and 65. If necessary, one or more curing operations may be performed to cure or partially cure the graphic or coloring layers.

On the same side of the substrate as the graphics and/or labeling colors, a thermochromic ink or other indicator material 24 is deposited onto substrate 20 such that it is situated directly above the area of controlled resistivity 62 of conductive circuit 18 and preferably over indicia 23. A clear protective coatings such as a varnish film, is then applied over and onto the indicator material, and optionally over the remaining regions of this side of substrate 20 to protect such regions from damage by subsequent manufacturing or storage operations. Each of the previously described layers or elements preferably have a thickness of from about 0.00005 inch to about 0.005 inch. The tester device, if necessary, can be cut to an appropriate size.

Figure 6:
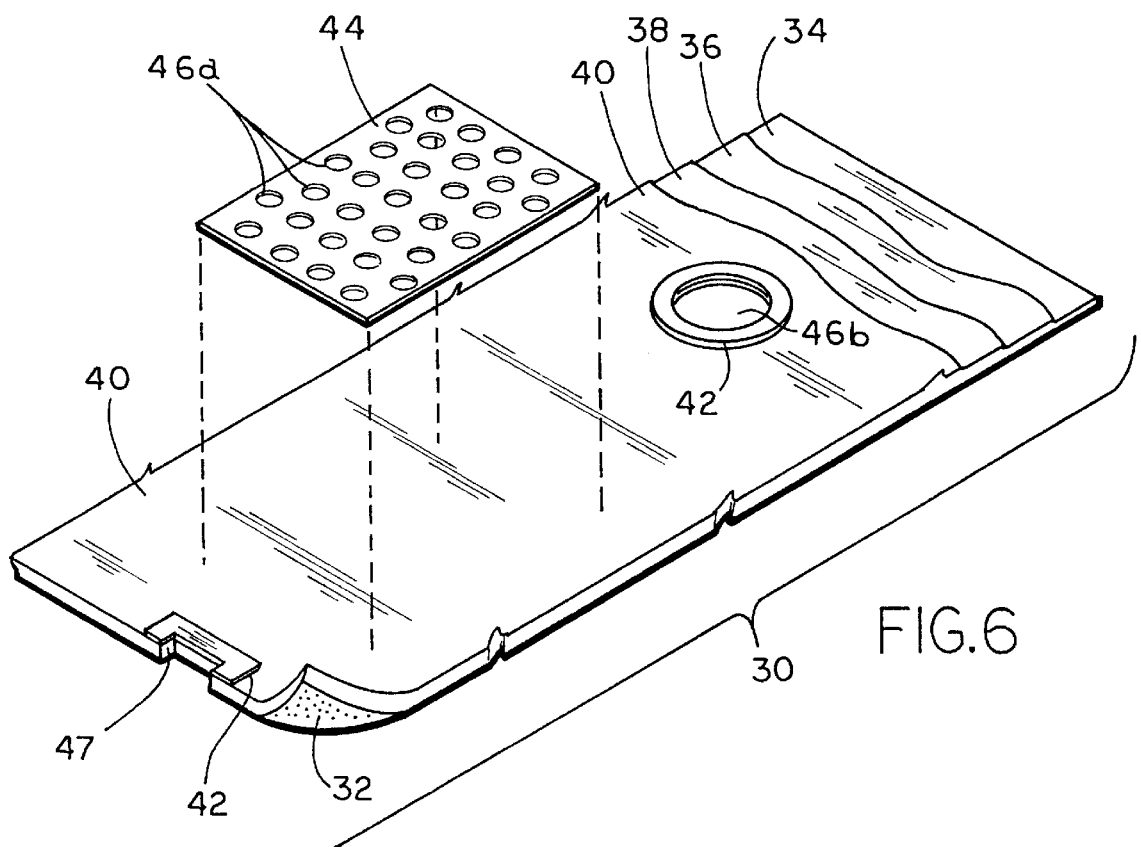
FIG. 6 is an exploded view of another subcomponent of the battery tester label, referred to herein as the base layer.

The second subcomponent of the preferred embodiment label 10 is a base laminate 30. As illustrated in FIGS. 2 and 6, base laminate 30 is a laminate or layered structure comprising a substrate 34, with one face having a layer of pressure-sensitive adhesive 32 for subsequent contact with a battery, and another face having one or more layers as follows: a metallization layer 36; a primer and/or decorative layer 38; an electrical insulation layer 40; and a thermal insulation layer 44. Also residing proximate to the thermal insulation layer are one or more switch throw pads 42 described in greater detail below.

Base laminate 30 is preferably prepared as follows. A plastic film is provided for the base layer substrate 34. The pressure-sensitive adhesive material 32 is deposited upon the face of the base layer substrate 34 that will subsequently face and contact the battery can 2. A silicone release liner is applied on the pressure-sensitive adhesive to facilitate handling and other processing operations. On the opposite face of base layer substrate 34, one or more graphic or labeling color layers are deposited, for instance, by printing. Preferably, metallization layer 36 is utilized to provide a decorative reflective layer. If a metallization layer is deposited, it will in most instances be necessary to deposit a receptive coating or primer layer 38 onto those regions of metallization layer 36 upon which other decorative layers are to be deposited. Primer layer 38 may in itself be a decorative layer. It is also desirable to deposit a layer of electrical insulation 40 upon metallization layer 36 and/or primer layer 38 to prevent electrical contact, i.e., shorting, between layer 36 and the conductive circuit 18 of tester device 15 during assembly of label 10.

Thermal insulation 44 is positioned in an area of base layer substrate 34 that will be disposed beneath the indicator material 24 and the maximum resistance area 62 of conductive circuit 18 of the previously described tester device 15. This thermal insulation reduces heat transfer from the area of controlled resistivity 62 of conductive circuit 18 to the battery. If such heat transfer is not controlled and the battery is permitted to act as a heat sink, the change in temperature at indicator material 24 may be insufficient to provide an accurate indication of the battery state of charge.

Thermal insulation 44, as shown, preferably comprises a plurality of apertures 46a which, when assembled into the laminate structure of the preferred label 10, provide air pockets which further thermally insulate the conductive circuit 18 from the battery. Optionally, a larger region of air space or void may be formed to serve as insulation by depositing a suitable spacer material onto the base laminate 30. The preferred insulative pattern is a series of islands printed onto layer 30 in the manner shown in FIG. 1A of U.S. Pat. No. 5,389,458.

Figure 8:
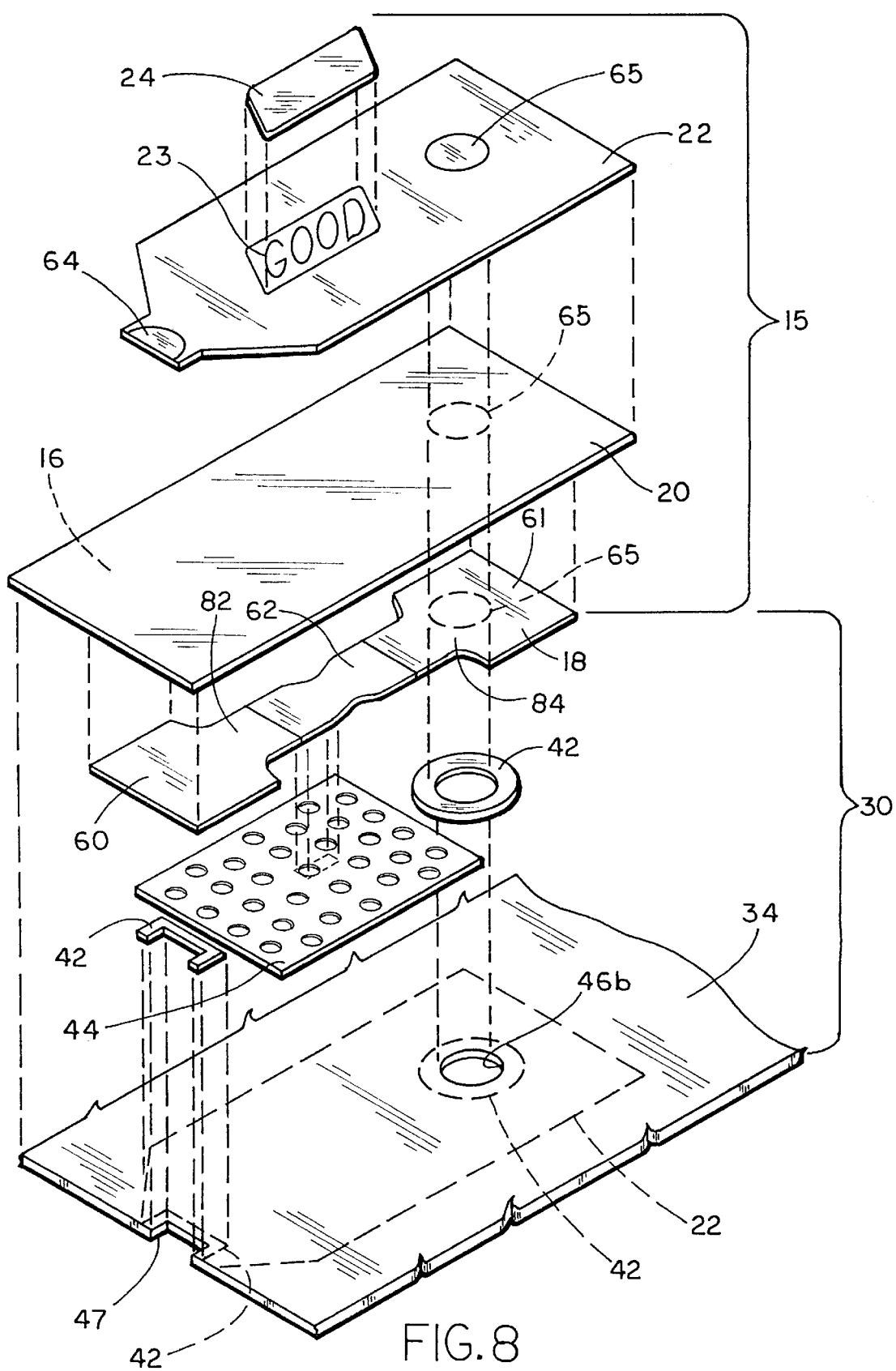
FIG. 8 is an exploded view of the battery tester label.

A switch throw pad 42 is also formed surrounding a switch aperture 46b. This raised pad provides spacing between switch segment 61 of the conductive circuit 18 and battery can 2, and significantly minimizes the occurrence of accidental switch closure. Raised switch throw pad 42 is preferably formed by depositing or printing a dielectric ink or other suitable material. A second switch pad 42 may be formed proximate a switch aperture 47 as shown in FIGS. 6 and 8. This pad has not been found necessary for proper functioning of the tester.

In all of the foregoing operations, one or more cure steps may be utilized when depositing or printing any of the previously described layers, particularly the decorative inks. Each of the previously described layers or elements preferably has a thickness from about 0.00005 inch to about 0.005 inch.

Switch apertures 46b and 47 are preferably formed in base laminate 30 after printing thermal insulation 44 and switch throw pad 42. Such apertures are preferably formed by suitable punching operations. Registry problems are minimized by printing what is to become switch pad 42 as a solid disk and thereafter punching aperture 46b centrally through this disk. Switch apertures are formed in the base laminate 30 so that when the previously described inserted tester device 15 is combined with base laminate 30, switch apertures 46b and 47 are located directly beneath the distal switch segments 60 and 61 of conductive circuit 18. The preferred geometry for such switch apertures is a notch 47 for the negative switch segment 64 and a circle 46b for the positive switch segment 65.

The switches utilized in the battery tester label are preferably membrane switches such that a switch segment 60 or 61 of conductive circuit 18 overlies apertures 46b and 47 in base laminate 30. Apertures 46b and 47 in base laminate 30 enable contact between conductive circuit 18 and either a battery terminal or can 2 on the other side of base laminate 30. Upon application of a force to a switch segment, such as by applying finger or thumb pressure at switch segments 64 or 65, a portion of the switch segment is pressed or deformed through the opening in base laminate 30 to contact the battery terminal or can 2. Upon release of the pressure, the portion of the switch segment resiliently "springs" away from and, thus, out of electrical contact with the battery terminal or can 2. This configuration is referred to herein as "switchably connected."

A significant advantage provided by the present invention battery tester label is the absence of electrically conductive layers or members to electrically connect and disconnect the tester, i.e., conductive circuit 18, to and from the battery. This is remarkable and of significant benefit particularly when manufacturing a battery tester label in large volumes and at a high rate. This advantage of eliminating otherwise necessary electrically conductive switching components is achieved in part by providing a first switch 64 which is disposed very near a battery terminal, such as negative terminal 4. Such close proximity eliminates the need for additional conductive elements to electrically connect an end of circuit 18 to the negative battery terminal. It is most preferred to fold or shrink the peripheral edge of label 10 over the battery end at which the negative terminal is disposed, as illustrated in FIG. 1.

The tester device 15 is combined with base laminate 30 as follows and as best shown in FIG. 8. The tester device is positioned onto or adjacent base laminate 30 so that switch segments 60 and 61 of conductive circuit 18 overlie switch apertures 46b and 47, respectively. Tester device 15 is oriented such that the layer of pressure-sensitive adhesive 16 (the release liner having been removed if previously applied) is facing base laminate 30. Upon application of sufficient pressure to tester device 15 and base laminate 30, the two assemblies are securely attached to each other via adhesive 16, and form the preferred battery tester label 10 of the present invention. Optionally, a clear laminating adhesive 52 is deposited upon the outward facing surface of the resulting tester label as illustrated in FIG. 2, and a clear film 54, such as polyvinyl chloride or polyester, is applied over the coating and the resulting assembly cured. A coating of adhesive 52 and film 54, when applied onto the tester label, provide protection for the tester device and components thereof. It is most preferred that the transparent protective layer resulting from adhesive coating 52 and film 54 is deposited upon the battery tester label prior to application of the tester label to a battery.

The resulting battery tester label 10 is appropriately die cut to the size of the battery desired. Upon removal of excess trimmed label, a plurality of individual tester labels are left remaining on the release liner previously applied to substrate 34 of base laminate 30. The liner and label array may then be cut into strips and wound into a roll and stored for subsequent application to batteries.

The substrate layer utilized for either or both the base layer substrate 34 and the tester device substrate 20 can be made of any desired dielectric polymer material. It is preferable to use a dielectric polymer material that will shrink when assembled on a battery. Generally, polyvinyl resins, polyolefin resins, polyester resins and the like would be suitable. Specific examples include polyvinyl chloride, polyethylene and polypropylene. It is contemplated that substrate 20 could also be formed from other dielectric materials besides plastics such as paper or other cellulose-based materials. The thickness of the substrate layers is not particularly limited, but is preferably in the range of from about 0.0005 to about 0.005 inch, and most preferably from about 0.001 to about 0.003 inch.

The previously described indicator layer 24 in the inserted tester device 15 comprises a thermally sensitive material for indicating the capacity of the battery. The preferred thermally sensitive materials change color in response to a temperature change, which change is readily viewable by a consumer. Thus, the consumer, based on the color change, can determine whether the battery is good or needs to be replaced. Examples of such thermally sensitive materials include liquid crystal materials and thermochromic inks. Examples of suitable liquid crystal materials are of the cholesteric type, such as cholesteryl oleate, cholesteryl chloride, cholesteryl caprylate and the like. The indicator material could change from colored to colorless, colorless to colored, or from one color to a second color. A tri-color material could also be used. The preferred battery tester 10 shown in FIGS. 1–8 utilizes an indicating material which changes from colored to colorless upon activation to reveal indicia 23 underneath the indicator material 24.

Indicating materials, such as thermochromic inks, can be used singly or in combination. For example, in one embodiment different layers of the indicating material are employed. The layers are activated at different temperatures or states and can be designed to change different colors at different temperatures. For example, the layer of indicating material activated at the highest temperature will preferably be the bottom layer, i.e., closest to the battery, and the outer layers are arranged in decreasing temperatures of activation with lowest temperature material in the outermost layer, and so, readily viewable at the exterior of the battery.

Either one or both switch segments 60 and 61 of conductive circuit 18 can be out of contact with the respective terminals of the battery so that the tester circuit is open. In one embodiment of the invention, one of the switch segment ends is permanently in electrical connection with one terminal of the battery, while the other switch segment end is positioned out of contact with the other battery terminal. By forcing the switch segment end into contact with the other battery terminal, the switch is closed and the tester circuit is completed to test the battery. The most preferred embodiment is to utilize a dual switch tester as shown in the accompanying drawings.

The labels useful in this invention can also comprise additional electrical and thermal insulative layers, printing layers, protective layers and the like. Suitable materials for use as the different layers are those typically used in battery labels and include plasticized or unplasticized polyvinyl chloride (UPVC), polyesters, metallic films, paper and the like. The tester label can be in the form of a shrinkable tube label in which a battery is encased.

Figure 7:
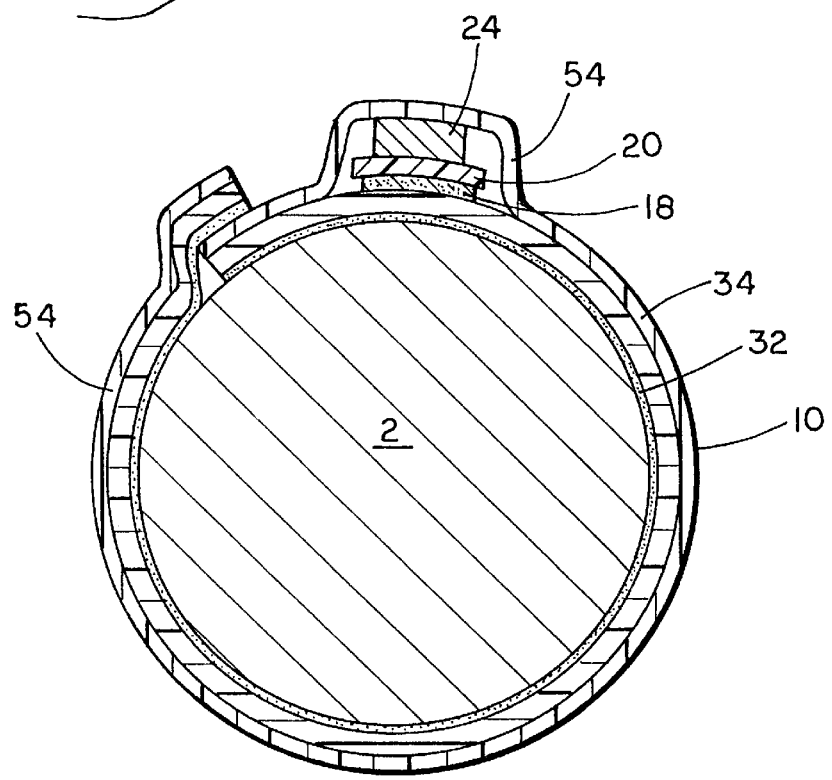
FIG. 7 is a cross section of a battery and the battery tester label.

The battery tester label of the present invention is preferably applied to a battery as follows. A previously assembled tester device 15, having its underside containing pressure-sensitive adhesive 16 exposed, is aligned with a previously formed base laminate 30 (disposed upon a releasable liner) such that the electrically conductive circuit 18 of the inserted tester device is positioned to contact the thermal insulation 44 of base laminate 30. Upon application of sufficient pressure, the respective layers are secured and joined to one another via pressure-sensitive adhesive 16 disposed on the mating surface of tester device 15. The resulting battery tester label 10 is then attached to the outer periphery of a battery can 2 by removing the liner of base laminate 30 to expose adhesive 32 on the underside of label 10 and contacting the underside of base laminate 30 to the battery can 2. FIG. 7 (not to scale) illustrates a typical cross section of the battery and label assembly 1. It is also possible to produce the tester label of the present invention and apply such to a battery without using preassembled tester device and/or base laminate subcomponents. In another embodiment, the battery and tester label assembly is formed by combining the tester device 15 and base laminate 30 as previously described. The resulting label is then itself stored, such as on a releasable liner in a wound roll, until needed.

The present invention also enables the production of multiple tester label assemblies. That is, a plurality of tester devices 15 can be aligned and mated with a plurality of base layer components, i.e., regions of thermal insulation, switch throw pads, and switch apertures, disposed upon and defined within a common base layer to form a plurality of battery tester labels 10. The resulting set of multiple label assemblies can then be stored for subsequent use, or separated into smaller groups of multiple label assemblies or into individual battery tester labels.

In the most preferred embodiment, a series of battery tester labels 10, as illustrated in FIG. 9, are formed on a common releasable liner 70 for subsequent application to batteries. In this most preferred process, an array of tester devices 15 is provided, each tester device formed as previously described and disposed upon a common releasable liner (not shown). A base laminate 30 is provided comprising a dielectric substrate 34, a liner 70 that is releasably secured to the underside of the substrate such as by previously noted pressure-sensitive adhesives, and a plurality of regions of thermal insulation 44 disposed on substrate 34. A plurality of apertures 46b and 47 are formed in the base layer through preprinted switch pad 42, in the case of aperture 46b. The arrays of base layers and tester devices are then slit into serial rolls. Upon removal of the releasable liner from the serial roll of tester devices, thereby exposing adhesive 16 on the underside of substrate 20, the tester devices 15 are oriented with base laminate 30 such that each conductive circuit (not shown) of the tester device roll faces a corresponding region of thermal insulation 44 of the base laminate 30, and so that the switch segments of each conductive circuit directly overlie a corresponding pair of apertures 46b and 47 formed in the base layer. The roll of tester devices is then affixed or otherwise secured to the base laminate, for instance by adhesive 16, to form a roll of battery tester labels 10 disposed on the common releasable liner 70 residing underneath the base laminate.

It is preferable to apply a layer of a transparent adhesive and clear film, such as 52 and 54 illustrated in FIG. 2, upon the exposed face of the array of tester devices 15. Upon sufficient curing, if necessary, the resulting coated assembly is die cut so that each individual battery tester label disposed on releasable liner 70 is correctly sized for the battery to receive the tester label. Die cutting is performed so that releasable liner 70 is not cut, so that the tester labels 10 remain on a common sheet to facilitate handling and storage. The excess trimmed label, referred to as the matrix, is then removed.

Although the tester circuit of the present invention has been described as being implemented in a battery label, it will be appreciated by those skilled in the art that the tester circuit may be provided on the battery packaging, on a separate tester strip, on the housing of a battery pack, or on a device that utilizes batteries.

The above description is considered that of the preferred embodiments only. Modifications of the invention will occur to those skilled in the art and to those who make or use the invention. Therefore, it is understood that the embodiments shown in the drawings and described above are merely for illustrative purposes and are not intended to limit the scope of the invention, which is defined by the following claims as interpreted according to the principles of patent law, including the Doctrine of Equivalents.

The invention claimed is:

1. A battery tester comprising:
a heating element for generating heat in response to current supplied from a battery, said heating element having a central portion and first and second connecting end portions on opposite ends of said central portion that are adapted to be coupled to opposite terminals of the battery; and
an indicator overlapping said central portion of said heating element, said indicator having a visual property that changes in response to the heat generated by said heating element,
wherein said connecting end portions of said heating element have a lower resistivity than said central portion.

2. The battery tester as defined in claim 1, wherein said connecting end portions are made with a different material than said central portion.

3. The battery tester as defined in claim 1, wherein at least one of said connecting end portions of said heating element includes a switch pad for selectively contacting one of the battery terminals.

4. The battery tester as defined in claim 1, wherein said heating element and said indicator are configured for inclusion in a battery label.

5. The battery tester as defined in claim 1, wherein at least a portion of said heating element is made of silver.

6. The battery tester as defined in claim 1, wherein said central portion of said heating element is formed of a material selected from the group consisting of carbon, nickel, silver-plated copper or combinations thereof.

7. The battery tester as defined in claim 6, wherein said connecting end portions are made of silver.

8. The battery tester as defined in claim 1, wherein said central portion and said connecting end portions of said heating element are made of the same material and said central portion has a property different from that of the connecting end portions so as to provide said central portion with a higher resistivity.

9. The battery tester as defined in claim 8, wherein the different property of said central portion is that the thickness of the material is less than that of said connecting end portions.

10. The battery tester as defined in claim 8, wherein the different property of said central portion is that a binder fraction in the material is higher for said portion than said connecting end portions.

11. The battery tester as defined in claim 8, wherein the material used to form said central and connecting end portions of said heating element is silver.

12. The battery tester as defined in claim 1, wherein said indicator is made of a thermochromic material that changes color in response to heat generated by said heating element.

13. A battery label comprising:
a label substrate;
a conductive element provided on said label substrate and having connecting end segments adapted to be coupled to opposite terminals of a battery and a central segment connected between said connecting end segments, said central segment having a higher resistivity than said connecting end segments, such that said central segment exhibits a greater change in temperature in response to changes in discharge level of the battery; and
an indicator provided on said central segment of said conductive element and having a visual property that changes in response to changes in temperature of said conductive element.

14. The battery label as defined in claim 13, wherein said connecting end segments are made with a different material than said central segment.

15. The battery label as defined in claim 13, wherein at least a portion of said conductive element is made of silver.

16. The battery label as defined in claim 13, wherein said central segment of said conductive element is formed of a material selected from the group consisting of carbon, nickel, silver-plated copper or combinations thereof.

17. The battery label as defined in claim 16, wherein said connecting end segments are made of silver.

18. The battery label as defined in claim 13, wherein said central segment and said connecting end segments of said conductive element are made of the same material and said central segment has a property different from that of the connecting end segments so as to provide said central segment with a higher resistivity.

19. The battery label as defined in claim 18, wherein the different property of said central segment is that the thickness of the material is less than that of said connecting end segments.

20. The battery label as defined in claim 18, wherein the different property of said central segment is that a binder fraction in the material is higher for said central segment than said connecting end segments.

21. The battery label as defined in claim 18, wherein the material used to form said central and connecting end segments of said conductive element is silver.

22. A battery comprising:
an electrochemical cell having a positive terminal and a negative terminal;
a label substrate adhered to an outer peripheral surface of said electrochemical cell;
a conductive element provided on said label substrate and coupled to said terminals of said electrochemical cell, said conductive element changes temperature in response to changes in discharge level of said electrochemical cell and has a central segment and a switching segment for selectively coupling an end of said central segment to one of said terminals of said electrochemical cell, said central segment having a resistivity that is higher than that of said switching segment; and
an indicator provided on said central segment of said conductive element and having a visual property that changes in response to changes in temperature of said conductive element.

23. The battery as defined in claim 22, wherein said electrochemical cell is a primary cell.

24. The battery as defined in claim 22, wherein said electrochemical cell is a secondary cell.

25. The battery as defined in claim 22, wherein said switching segment is made with a different material than said central segment.

26. The battery as defined in claim 22, wherein said central segment and said switching segment of said conductive element are made of the same material and said central segment has a property different from that of said switching segment so as to provide said central segment with a higher resistivity.

27. An on-label battery tester comprising:
a heating element having first and second ends adapted to be coupled to opposite terminals of a battery, at least one of the ends is formed as a switch pad, said heating element generates heat in response to current supplied from the battery; and
a thermochromic indicator layer overlapping a central portion of said heating element, said thermochromic indicator layer changes color in response to the heat generated by said heating element,
wherein said heating element includes said central portion and end portions made of the same material and said end portions being positioned on opposite ends of said central portion, said central portion having a property different from that of said end portions so as to provide said central portion with a higher resistivity than said end portions.

28. The battery tester as defined in claim 27, wherein said heating element is formed of a material selected from the group consisting of silver, carbon, nickel, silver-plated copper or combinations thereof.

* * * * *